(12) United States Patent
Fujimoto et al.

(10) Patent No.: US 11,504,742 B2
(45) Date of Patent: Nov. 22, 2022

(54) VIBRATION DEVICE

(71) Applicant: Murata Manufacturing Co., Ltd., Nagaokakyo (JP)

(72) Inventors: Katsumi Fujimoto, Nagaokakyo (JP); Chikahiro Horiguchi, Nagaokakyo (JP); Kenji Nishiyama, Nagaokakyo (JP); Yasuhiro Kuratani, Nagaokakyo (JP); Shinichiro Ichiguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 454 days.

(21) Appl. No.: 16/597,871

(22) Filed: Oct. 10, 2019

(65) Prior Publication Data

US 2020/0038914 A1 Feb. 6, 2020

Related U.S. Application Data

(63) Continuation of application No. PCT/JP2017/044348, filed on Dec. 11, 2017.

(30) Foreign Application Priority Data

Apr. 28, 2017 (JP) .............................. JP2017-089410

(51) Int. Cl.
*B06B 1/06* (2006.01)
*B06B 1/04* (2006.01)

(52) U.S. Cl.
CPC ............ *B06B 1/0648* (2013.01); *B06B 1/045* (2013.01)

(58) Field of Classification Search
CPC ..... B06B 1/0633; B06B 1/045; B06B 1/0648; H03H 9/564; H03H 9/171; H03H 9/13; H01L 41/0533
See application file for complete search history.

(56) References Cited

U.S. PATENT DOCUMENTS 11,161,148 B2 * 11/2021 Fujimoto .............. G03B 17/08
2003/0214588 A1 11/2003 Takizawa et al.
(Continued)

FOREIGN PATENT DOCUMENTS

CN 1460890 A 12/2003
JP 2006-333679 A 12/2006
(Continued)

OTHER PUBLICATIONS

Official Communication issued in International Patent Application No. PCT/JP2017/044348, dated Mar. 13, 2018.
(Continued)

*Primary Examiner* — J. San Martin
(74) *Attorney, Agent, or Firm* — Keating & Bennett, LLP (57) ABSTRACT

A vibration device includes a light-transmitting body that is located on a subject side of an imaging element, a cylindrical body that includes a first end portion, a second end portion on the opposite side from the first end portion, and an outer surface and an inner surface that connect the first end portion and the second end portion to each other, the cylindrical body being connected to the light-transmitting body and holding the light-transmitting body on the first end portion side thereof, and a piezoelectric element provided along a circumferential direction of the cylindrical body and that torsionally vibrates the cylindrical body.

19 Claims, 8 Drawing Sheets

(56) References Cited

U.S. PATENT DOCUMENTS

| | | | |
|---|---|---|---|
| 2006/0267454 A1 | 11/2006 | Ashizawa et al. | |
| 2012/0243093 A1* | 9/2012 | Tonar | G02B 27/0006 |
| | | | 359/507 |
| 2014/0036084 A1 | 2/2014 | Lu | |
| 2018/0095272 A1* | 4/2018 | Fujimoto | B06B 3/02 |
| 2018/0188526 A1* | 7/2018 | Li | B60S 1/56 |
| 2018/0210194 A1* | 7/2018 | Nishiyama | B06B 1/06 |
| 2018/0239218 A1* | 8/2018 | Ikeuchi | H04N 5/2253 |
| 2019/0151897 A1* | 5/2019 | Fujimoto | G03B 17/02 |
| 2020/0338607 A1* | 10/2020 | Kitamori | H04N 5/22521 |

FOREIGN PATENT DOCUMENTS

| | | |
|---|---|---|
| JP | 2007-189802 A | 7/2007 |
| JP | 2010-181584 A | 8/2010 |
| JP | 2013-080177 A | 5/2013 |
| JP | 2017-085276 A | 5/2017 |
| JP | 2017-170303 A | 9/2017 |
| WO | 2017/022382 A1 | 2/2017 |
| WO | 2017/110563 A1 | 6/2017 |

OTHER PUBLICATIONS

Official Communication issued in corresponding Chinese Patent Application No. 201780090103.3, dated Dec. 28, 2020.

\* cited by examiner

VIBRATION DEVICE

CROSS REFERENCE TO RELATED APPLICATIONS

This application claims the benefit of priority to Japanese Patent Application No. 2017-089410 filed on Apr. 28, 2017 and is a Continuation Application of PCT Application No. PCT/JP2017/044348 filed on Dec. 11, 2017. The entire contents of each application are hereby incorporated herein by reference.

BACKGROUND OF THE INVENTION

1. Field of the Invention

The present invention relates to a vibration device capable of removing water droplets and the like through mechanical vibration.

2. Description of the Related Art

Heretofore, there has been a demand for the field of view to be always clear in imaging devices, such as cameras used as surveillance devices. In particular, various mechanisms for removing water droplets such as raindrops have been proposed for cameras used outdoors such as in automotive applications. Japanese Unexamined Patent Application Publication No. 2013-080177 discloses a camera having a water-droplet-removing function that includes an imaging unit and a vibration unit that vibrates the imaging unit. The imaging unit includes a lens and an imaging element that photoelectrically converts light transmitted through the lens. The vibration unit vibrates the imaging unit in a direction in which the optical axis of the lens swings and in a direction parallel to the optical axis in order to remove water droplets attached to the lens.

In the camera having the water-droplet-removing function as described in Japanese Unexamined Patent Application Publication No. 2013-080177, there are cases where water droplets that are inside the field of view of the camera and attached to the lens cannot be reliably removed.

SUMMARY OF THE INVENTION

Preferred embodiments of the present invention provide vibration devices that are each able to reliably remove water droplets and the like that are inside the field of view of an imaging device and attached to the surface of a light-transmitting body located on the subject side of an imaging element.

A vibration device according to a preferred embodiment of the present invention includes a light-transmitting body that is located on a subject side of an imaging element; a cylindrical body that includes a first end portion, a second end portion on an opposite side from the first end portion, and an outer surface and an inner surface that connect the first end portion and the second end portion to each other, the cylindrical body being connected to the light-transmitting body and holding the light-transmitting body on the first end portion side thereof; and a piezoelectric element that is provided along a circumferential direction of the cylindrical body and that torsionally vibrates the cylindrical body.

In a vibration device according to a preferred embodiment of the present invention, at least one of the outer surface and the inner surface includes a step portion in a portion thereof located between a portion where the piezoelectric element is provided and the first end portion in a direction that connects the first end portion and the second end portion of the cylindrical body to each other, and when a distance between the outer surface and the inner surface is regarded as a thickness of the cylindrical body, the thickness decreases via the step portion from a side close to the piezoelectric element toward a side close to the first end portion. In this case, the displacement of the light-transmitting body achieved by the torsional vibration of the cylindrical body is able to be further increased. Therefore, water droplets and the like attached to the surface of the light-transmitting body inside the field of view of the imaging device are able to be more reliably removed.

In a vibration device according to a preferred embodiment of the present invention, the outer surface of the cylindrical body includes the step portion, and a portion of the outer surface that is continuous with the step portion and extends toward the first end portion is located more inwardly than a portion of the outer surface that is continuous with the step portion and extends toward the piezoelectric element. In this case, the vibration device is able to be reduced in size.

In a vibration device according to a preferred embodiment of the present invention, at least one of the outer surface and the inner surface includes an inclined portion that extends and is inclined with respect to the direction that connects the first end portion and the second end portion of the cylindrical body to each other in a portion of the cylindrical body located between the portion where the piezoelectric element is provided and the first end portion in the direction that connects the first end portion and the second end portion of the cylindrical body to each other, and when a distance between the outer surface and the inner surface is regarded as a thickness of the cylindrical body, the inclined portion is provided so that the thickness decreases from a side close to the piezoelectric element toward a side close to the first end portion. In this case, water droplets and the like attached to the surface of the light-transmitting body inside the field of view of the imaging device are able to be more reliably removed.

In a vibration device according to a preferred embodiment of the present invention, the outer surface of the cylindrical body includes the inclined portion, and the inclined portion extends from the side close to the piezoelectric element toward the side close to the first end portion and toward an interior of the cylindrical body. In this case, the vibration device is able to be reduced in size.

In a vibration device according to a preferred embodiment of the present invention, the piezoelectric element is located between the first end portion and the second end portion of the cylindrical body.

In a vibration device according to a preferred embodiment of the present invention, the piezoelectric element is located at a position of a node of a torsional vibration of the cylindrical body. In this case, the piezoelectric element is not likely to deform and is not likely to be damaged.

In a vibration device according to a preferred embodiment of the present invention, a plurality of the piezoelectric elements are provided, the plurality of piezoelectric elements are provided in an annular shape along a circumferential direction of the cylindrical body and spaced apart from each other, the plurality of piezoelectric elements each include a piezoelectric body, and the plurality of piezoelectric bodies are polarized to follow the circumferential direction of the cylindrical body.

In a vibration device according to a preferred embodiment of the present invention, the piezoelectric element includes a ring-shaped piezoelectric body, the ring-shaped piezoelectric body includes a first main surface that is located on a side close to the first end portion of the cylindrical body and a second main surface that is located on a side close to the second end portion of the cylindrical body, the ring-shaped piezoelectric body is divided into a plurality of regions along the circumferential direction of the cylindrical body and the ring-shaped piezoelectric body is polarized to follow the circumferential direction of the cylindrical body in the plurality of regions, and excitation electrodes are provided on the first main surface and the second main surface, the excitation electrodes covering the plurality of regions.

In a vibration device according to a preferred embodiment of the present invention, the ring-shaped piezoelectric body is divided into at least six regions.

In a vibration device according to a preferred embodiment of the present invention, the vibration device further includes a piezoelectric vibrator that is a piezoelectric element other than the piezoelectric element, and the piezoelectric vibrator provides a vibration mode that is one of a vibration mode in which the piezoelectric vibrator vibrates the cylindrical body in a direction that connects the inner surface and the outer surface to each other and a vibration mode in which the piezoelectric vibrator vibrates the cylindrical body in a direction that connects the first end portion and the second end portion to each other. In this case, water droplets and the like attached to the surface of the light-transmitting body inside the field of view of the imaging device are able to be more reliably removed.

According to the preferred embodiments of the present invention, vibration devices that are each able to reliably remove water droplets and the like that are inside the field of view of an imaging device and attached to the surface of a light-transmitting body located on the subject side of an imaging element are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be made clearer by describing specific preferred embodiments of the present invention with reference to the drawings.

The preferred embodiments described in the present specification are illustrative examples and portions of the configurations illustrated in different preferred embodiments are able to be substituted for one another or combined with one another.

Figure 1:
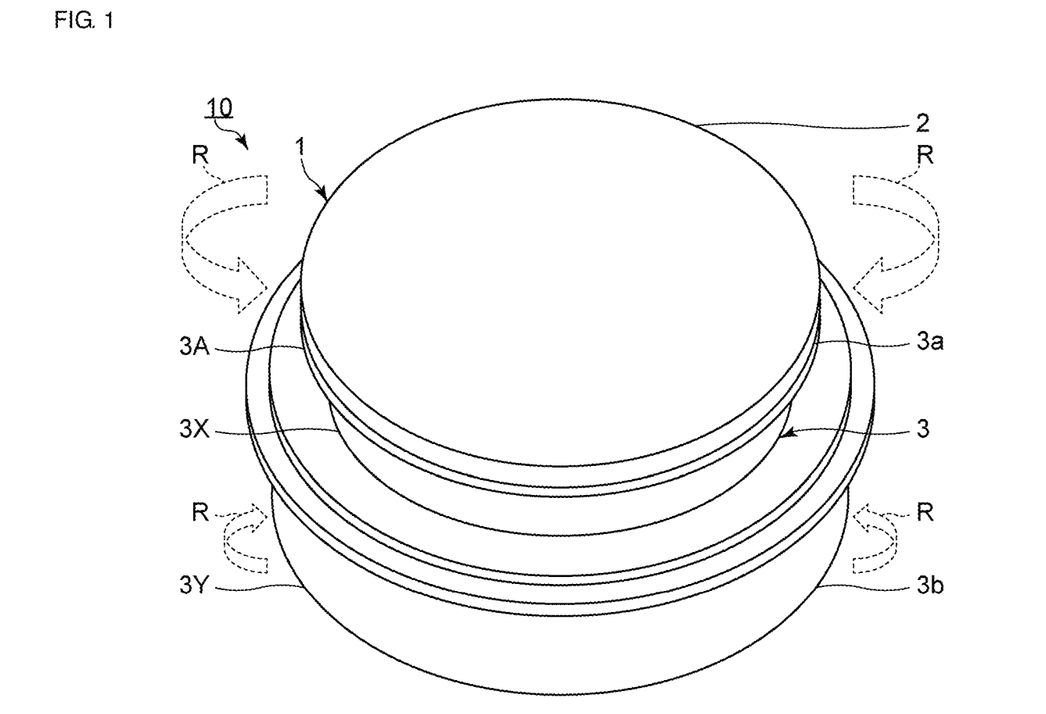
FIG. 1 is a perspective view of a vibration device according to a first preferred embodiment of the present invention.
Figure 2:
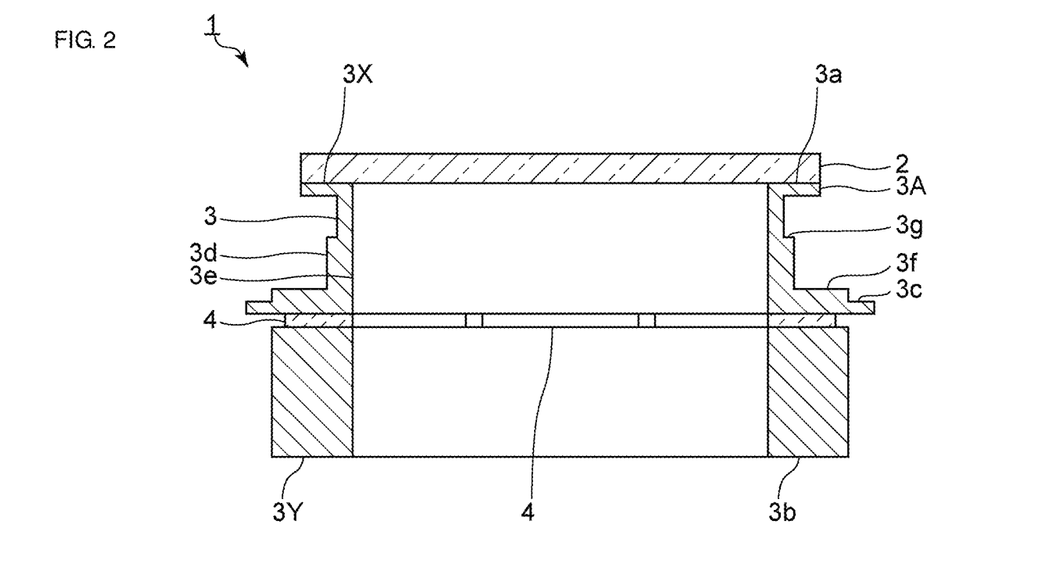
FIG. 2 is a front sectional view of the vibration device according to the first preferred embodiment of the present invention.
Figure 3:
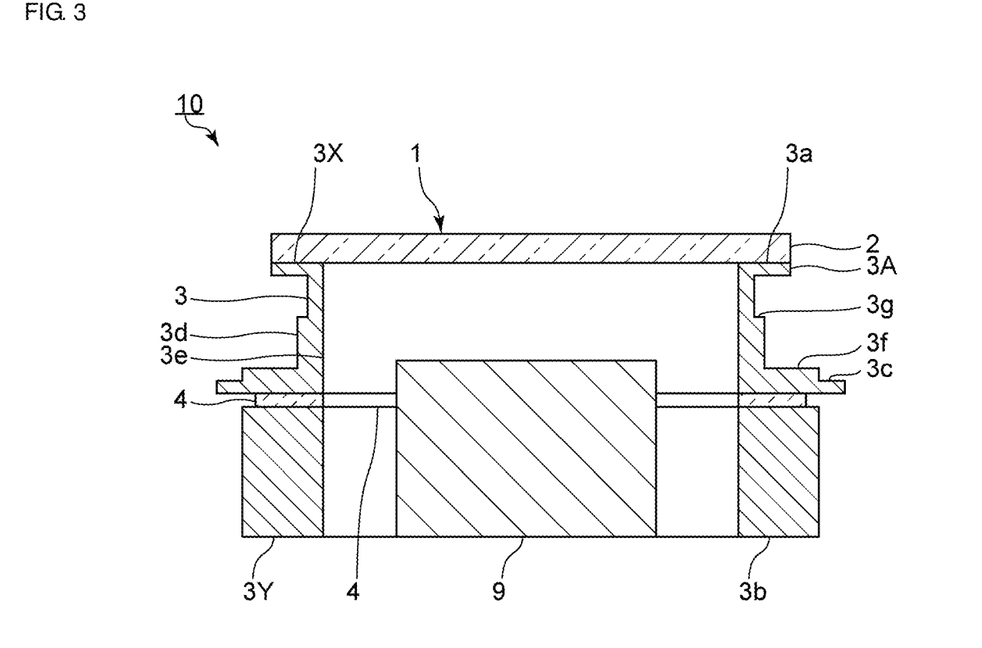
FIG. 3 is a front sectional view of an imaging device that includes the vibration device of the first preferred embodiment of the present invention.

FIG. 1 is a perspective view of a vibration device according to a first preferred embodiment of the present invention. FIG. 2 is a front sectional view of the vibration device according to the first preferred embodiment. FIG. 3 is a front sectional view of an imaging device that includes the vibration device of the first preferred embodiment.

As illustrated in FIGS. 1 and 2, a vibration device 1 includes a light-transmitting body 2. As illustrated in FIG. 3, in an imaging device 10, the light-transmitting body 2 is located on a subject side of an imaging element 9, that is, in front of the imaging element 9. Examples of the imaging element 9 include a CMOS, a CCD, a bolometer, a thermopile, and the like that receive light of any wavelength from the visible region to the far infrared region. Examples of the imaging device 10 include a camera, radar and LIDAR devices, and so on.

The light-transmitting body 2 is made of a light-transmitting material. A light-transmitting plastic, glass, or a light-transmitting ceramic, for example, may be used as the light-transmitting material. In the first preferred embodiment, the light-transmitting body 2 preferably has a disk shape. In addition, the shape of the light-transmitting body 2 is not limited to this example, and, for example, may instead have a dome shape.

A cylindrical body 3 is connected to the light-transmitting body 2. The cylindrical body 3 includes a first end portion 3a, a second end portion 3b that is on the opposite side from the first end portion 3a, and an outer surface 3d and an inner surface 3e that connect the first end portion 3a and the second end portion 3b to each other. In the first preferred embodiment, the inner surface 3e faces the side surface of the cylinder, and the direction connecting the inner surface 3e and the outer surface 3d to each other is the radial direction of the cylindrical body 3. The direction connecting the first end portion 3a and the second end portion 3b to each other is the axial direction of the cylindrical body 3.

A plurality of piezoelectric elements 4 are provided between the first end portion 3a and the second end portion 3b of the cylindrical body 3. More specifically, the cylindrical body 3 includes a first cylindrical body portion 3X that includes the first end portion 3a and a second cylindrical body portion 3Y that includes the second end portion 3b, and the plurality of piezoelectric elements 4 are provided between the first cylindrical body portion 3X and the second cylindrical body portion 3Y. The cylindrical body 3 is defined by integrating the first cylindrical body portion 3X and the second cylindrical body portion 3Y with each other with the piezoelectric elements 4 located therebetween. In addition, the cylindrical body 3 may instead include one cylindrical body. In this case, for example, grooves may be provided in the cylindrical body 3 and the piezoelectric elements 4 may be provided in the grooves. Alternatively, the piezoelectric elements 4 may be provided at a step portion or the like provided in the cylindrical body 3.

The first end portion 3a is connected to the light-transmitting body 2. More specifically, the cylindrical body 3 includes a support portion 3A that includes the first end portion 3a. The support portion 3A of the cylindrical body 3 is fixed to a peripheral portion of the surface of the light-transmitting body on the cylindrical body 3 side so that an opening of the cylindrical body 3 on the first end portion 3a side is closed by the light-transmitting body 2. In addition, the support portion 3A may instead be fixed to a portion of the surface of the light-transmitting body 2 on the cylindrical body 3 side that is further toward the inside than the peripheral portion.

The cylindrical body 3 is preferably made of, for example, stainless steel in the first preferred embodiment. However, another metal material may be used instead of stainless steel. Preferably, for example, a metal that is an elastic material with high rigidity such as stainless steel is used. Alternatively, the cylindrical body 3 may include a composite body including a resin and a material with a higher rigidity than the resin, or may be made of glass.

A hinge portion 3c, which extends outward in the radial direction of the cylindrical body 3, is provided on the outer surface 3d of the cylindrical body 3. The hinge portion 3c supports the vibration device 1 from the outside. The plurality of piezoelectric elements 4 are provided close to the hinge portion 3c in the axial direction of the cylindrical body 3. The positional relationship between the hinge portion 3c and the piezoelectric elements 4 is not limited to this example.

Figure 4:
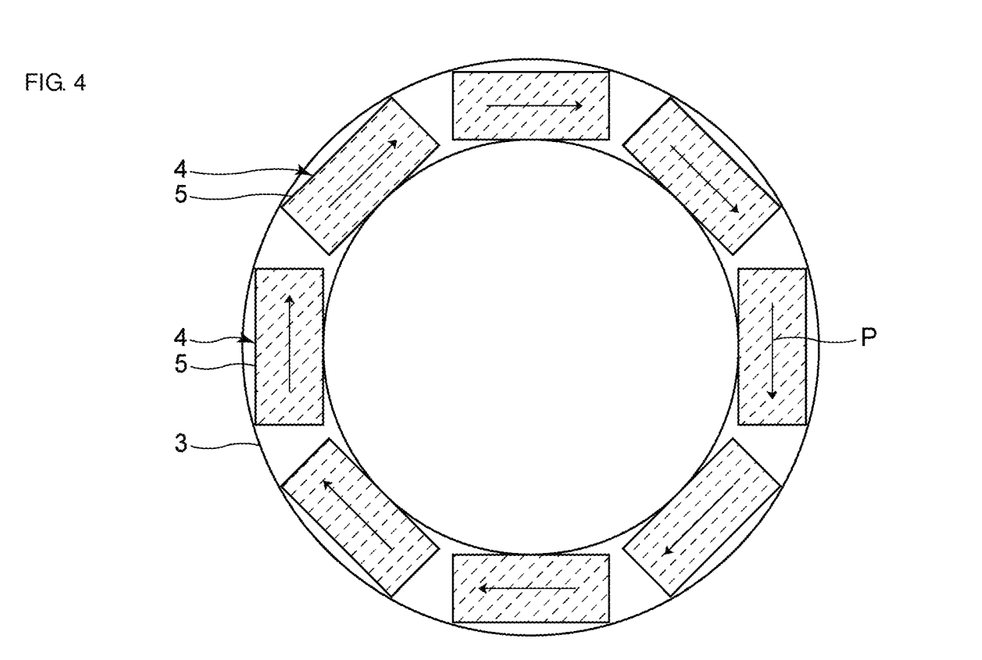
FIG. 4 is a plan sectional view of piezoelectric elements of the vibration device of the first preferred embodiment of the present invention.

FIG. 4 is a plan sectional view of the piezoelectric elements of the vibration device of the first preferred embodiment.

The plurality of piezoelectric elements 4 are provided in an annular shape along a circumferential direction of the cylindrical body 3. The plurality of piezoelectric elements 4 are spaced apart from each other. The plurality of piezoelectric elements 4 each include a piezoelectric body 5. The shape of the piezoelectric body 5 is not particularly limited, and is a rectangular parallelepiped shape or a substantially rectangular parallelepiped shape in the first preferred embodiment. Arrows P in FIG. 4 indicate the polarization directions of the piezoelectric bodies 5. The piezoelectric bodies 5 are polarized along the circumferential direction. More specifically, the plurality of piezoelectric bodies 5 are polarized and follow the circumferential direction.

Here, each piezoelectric body 5 includes a first main surface and a second main surface that are respectively located on the first end portion side and the second end portion side of the cylindrical body 3 and face each other. Excitation electrodes are provided on the first main surface and the second main surface. An alternating-current voltage is applied to the excitation electrodes. The piezoelectric elements 4 of the first preferred embodiment are shear mode piezoelectric elements that undergo sliding deformation in response to application of a voltage. When an alternating-current voltage is applied to the plurality of piezoelectric elements 4 located along the circumferential direction of the cylindrical body 3, the cylindrical body 3 torsionally vibrates as indicated by arrows R in FIG. 1.

Returning to FIG. 3, in the first preferred embodiment, the plurality of piezoelectric elements 4 are located at the position of a node of the torsional vibration of the cylindrical body 3.

The outer surface 3d of the cylindrical body 3 includes a first step portion 3f and a second step portion 3g. The first step portion 3f and the second step portion 3g extend in the radial direction of the cylindrical body 3 and extend along the circumferential direction of the cylindrical body 3. The first step portion 3f and the second step portion 3g are located between a portion where the piezoelectric elements 4 are located and the first end portion 3a in the axial direction of the cylindrical body 3. The first step portion 3f is located closer to the piezoelectric elements 4 than the second step portion 3g.

Here, the distance between the outer surface 3d and the inner surface 3e is referred to as the thickness of the cylindrical body 3. The thickness of the cylindrical body 3 changes via the first step portion 3f and the second step portion 3g. More specifically, the thickness decreases from the side close to the piezoelectric elements 4 toward the first end portion 3a via the first step portion 3f. Similarly, the thickness decreases from the side close to the first step portion 3f toward the first end portion 3a via the second step portion 3g. Thus, the thickness of the cylindrical body 3 decreases in two steps between the piezoelectric elements 4 and the first end portion 3a. The number of locations where a step portion is provided in the cylindrical body 3 is not particularly limited. Alternatively, step portions do not have to be provided in the cylindrical body 3.

In the first preferred embodiment, the thickness of the support portion 3A of the cylindrical body 3 is larger than the thickness of the portion of the cylindrical body 3 located between the support portion 3A and the second step portion 3g. As a result, the light-transmitting body 2 is able to be suitably fixed to the cylindrical body 3. However, the thickness of the support portion 3A may instead be the same or substantially the same as the thickness of the portion of the cylindrical body 3 located between the second step portion 3g and the support portion 3A.

In the first preferred embodiment, the portion of the outer surface 3d that is continuous with the first step portion 3f and extends toward the first end portion 3a is located closer to the inside than the portion of the outer surface 3d that is continuous with the first step portion 3f and extends toward the piezoelectric elements 4. Similarly, the portion of the outer surface 3d that is continuous with the second step portion 3g and extends toward the first end portion 3a is located closer to the inside than the portion of the outer surface 3d that is continuous with the second step portion 3g and extends toward the piezoelectric elements 4. Accordingly, the vibration device 1 is able to be reduced in size.

A feature of the first preferred embodiment is that the vibration device 1 includes a plurality of piezoelectric elements that are located along the circumferential direction of the cylindrical body 3 and torsionally vibrate the cylindrical body 3. The light-transmitting body 2, which is bonded to the cylindrical body 3, rotates as a result of the cylindrical body 3 torsionally vibrating. At this time, a centrifugal force acts on water droplets and foreign matter attached to the surface of the light-transmitting body 2. Accordingly, a force acting toward the space outside the field of view of the imaging device 10 is reliably applied to the water droplets and foreign matter. Therefore, water droplets and foreign matter inside the field of view of the imaging device 10 are able to be reliably removed.

In addition, in the first preferred embodiment, the thickness of the cylindrical body 3 becomes smaller toward first end portion 3a as a result of the cylindrical body 3 including the first step portion 3f and the second step portion 3g. Consequently, torsional vibration displacement of the first end portion 3a is able to be made even larger and displacement of the light-transmitting body 2 in the circumferential direction is able to be made even larger. Therefore, the centrifugal force acting on water droplets and foreign matter attached to the surface of the light-transmitting body 2 is able to be made even larger and the water droplets and foreign matter inside the field of view of the imaging device 10 are able to be removed even more reliably.

As described above, the number of locations where a step portion is provided in the cylindrical body 3 is not particularly limited, and for example, a step portion may be provided in one place.

Figure 5:
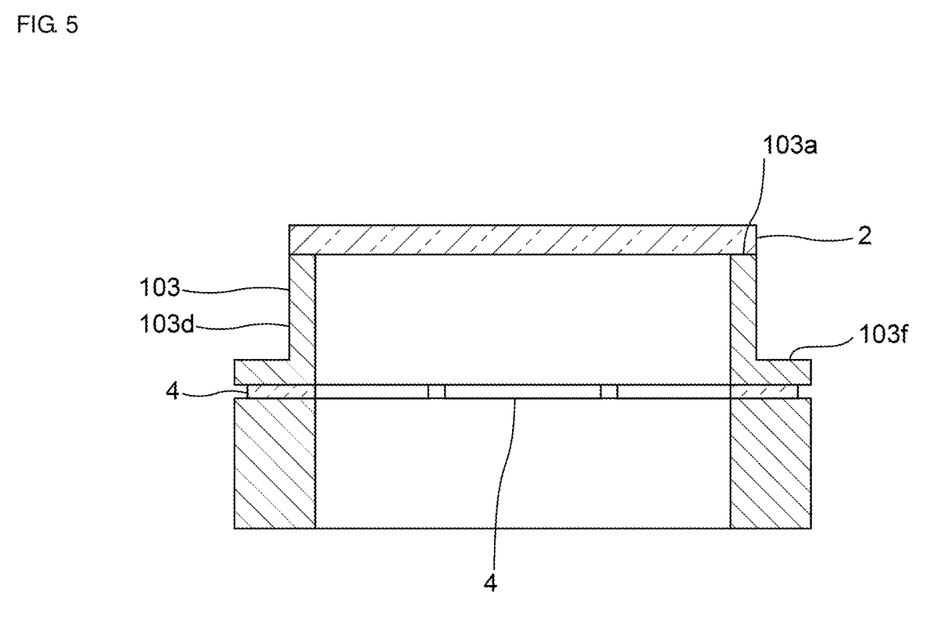
FIG. 5 is a front sectional view of a vibration device according to a first modification of the first preferred embodiment of the present invention.

FIG. 5 is a front sectional view of a vibration device according to a first modification of the first preferred embodiment.

In the first modification, one step portion 103f is provided on an outer surface 103d of a cylindrical body 103. The thickness of the portion of the cylindrical body 103 that is closer to a first end portion 103a than the step portion 103f is the same or substantially the same as the thickness of the portion of the cylindrical body 3 of the first preferred embodiment illustrated in FIG. 3 located between the first step portion 3f and the second step portion 3g.

Figure 6:
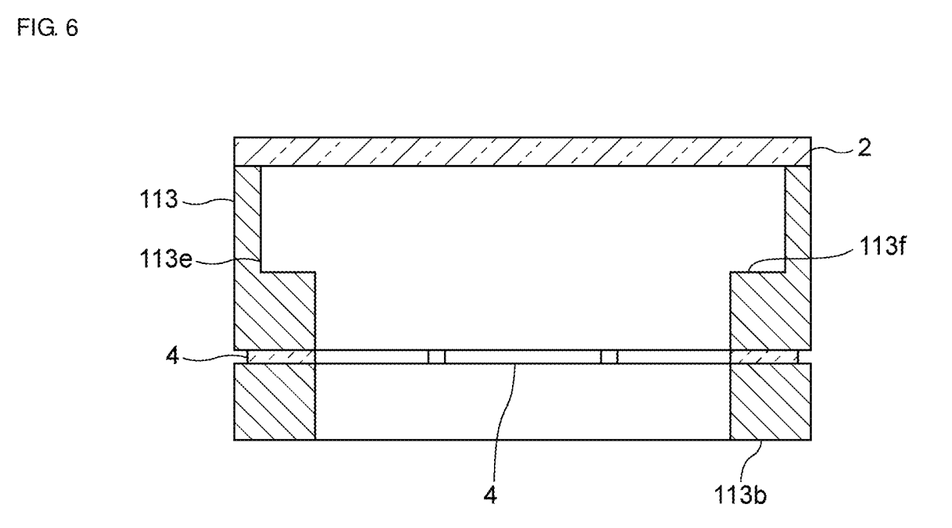
FIG. 6 is a front sectional view of a vibration device according to a second modification of the first preferred embodiment of the present invention.

FIG. 6 is a front sectional view of a vibration device according to a second modification of the first preferred embodiment.

In the second modification, a step portion 113f is provided on an inner surface 113e of a cylindrical body 113. In the second modification, the piezoelectric elements 4 are provided closer to a second end portion 113b than in the first preferred embodiment and the first modification.

Displacements of the torsional vibrations of the vibration devices of the first preferred embodiment, the first modification, and the second modification were evaluated. The dimension of the cylindrical body along the axial direction was referred to as the height of the cylindrical body. A value obtained by dividing the displacement of the light-transmitting body in the circumferential direction by the displacement of the second end portion of the cylindrical body in the circumferential direction was referred to as an amplification ratio.

The specifications of the cylindrical body of the first preferred embodiment were as follows.
  Total height: about 15.6 mm
  Height from second end portion to piezoelectric elements: about 7.0 mm
  Outer diameter of portion between piezoelectric elements and first step portion: about 22.0 mm
  Thickness of portion between piezoelectric elements and first step portion: about 3.0 mm
  Thickness of portion between first step portion and second step portion: about 2.0 mm
  Thickness of portion between second step portion and support portion: about 1.0 mm The specifications of the cylindrical body of the first modification were as follows.
  Total height: about 15.6 mm
  Height from second end portion to piezoelectric elements: about 7.0 mm
  Outer diameter of portion between piezoelectric elements and step portion: about 22.0 mm
  Thickness of portion between piezoelectric elements and step portion: about 3.0 mm
  Thickness of portion between step portion and first end portion: about 1.0 mm The specifications of the cylindrical body of the second modification were as follows.
  Total height: about 17.6 mm
  Height from second end portion to piezoelectric elements: about 4.0 mm
  Outer diameter of portion between piezoelectric elements and step portion: about 22.0 mm
  Thickness of portion between piezoelectric elements and step portion: about 3.0 mm
  Thickness of portion between step portion and first end portion: about 1.0 mm In the first preferred embodiment, the amplification ratio was about 1486 nm/282 nm. In the first modification, the amplification ratio was about 960 nm/288 nm. In the second modification, the amplification ratio was about 902 nm/460 nm. Thus, the displacement of the light-transmitting body due to torsional vibration of the cylindrical body is increased in the first preferred embodiment, the first modification, and the second modification. Since the piezoelectric elements are located closer to the first end portion in the first preferred embodiment and the first modification than in the second modification, the amplification ratio is able to be effectively increased in the first preferred embodiment and the first modification. In addition, since the thickness of the cylindrical body decreases toward the first end portion in the first preferred embodiment, the amplification ratio is able to be further increased.

In the first preferred embodiment illustrated in FIG. 3, the thickness of the cylindrical body 3 decreases via the first step portion 3f and the second step portion 3g, and as a result the portion of the cylindrical body 3 with a small thickness has a small dimension along the axial direction. Therefore, in the first preferred embodiment, a decrease in strength is less likely to occur and the amplification ratio is able to be further increased.

Figure 7:
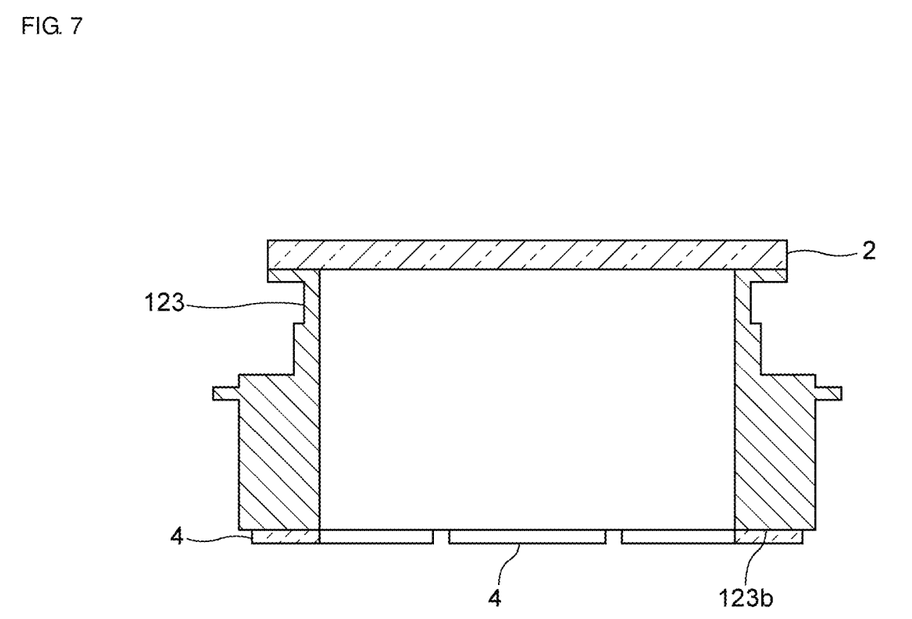
FIG. 7 is a front sectional view of a vibration device according to a third modification of the first preferred embodiment of the present invention.

FIG. 7 is a front sectional view of a vibration device according to a third modification of the first preferred embodiment.

In the third modification, a cylindrical body 123 is defined by an integrated body and the plurality of piezoelectric elements 4 are provided on a second end portion 123b. Thus, the position at which the plurality of piezoelectric elements 4 are located in the axial direction of the cylindrical body 123 is not particularly limited.

However, the plurality of piezoelectric elements 4 are preferably located, for example, at the position of a node of the torsional vibration of the cylindrical body 3 as in the first preferred embodiment illustrated in FIG. 3. As a result, the piezoelectric elements 4 are not likely to deform and are not likely to be damaged. In addition, in the first preferred embodiment, the hinge portion 3c is located close to the piezoelectric elements 4 and is provided close to the position of a node, and therefore the torsional vibration is not likely to be attenuated even when the vibration device 1 is supported from the outside.

Figure 8:
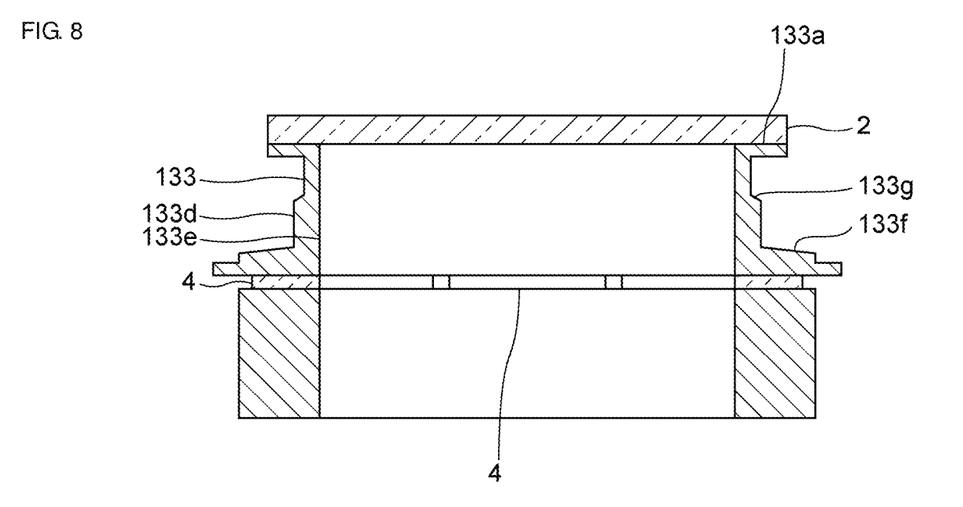
FIG. 8 is a front sectional view of a vibration device according to a fourth modification of the first preferred embodiment of the present invention.

FIG. 8 is a front sectional view of a vibration device according to a fourth modification of the first preferred embodiment.

In the fourth modification, an outer surface 133d of a cylindrical body 133 includes a first inclined portion 133f and a second inclined portion 133g that extend and are inclined with respect to the axial direction of the cylindrical body 133. The first inclined portion 133f is provided so that the thickness thereof decreases from the side close to the piezoelectric elements 4 toward the side close to a first end portion 133a. The first inclined portion 133f extends from the side close to the piezoelectric elements 4 toward the side close to the first end portion 133a and extends toward the inside of the cylindrical body 133. In addition, the first inclined portion 133f extends along the circumferential direction of the cylindrical body 133. The second inclined portion 133g includes features similar to the first included portion 133f. Thus, similarly to the first preferred embodiment, displacement of the light-transmitting body 2 in the circumferential direction is able to be further increased and size reduction is able to be achieved.

The number of locations where an inclined portion is provided in the cylindrical body 133 is not particularly limited. An inclined portion may be provided on an inner surface 133e.

Figure 9:
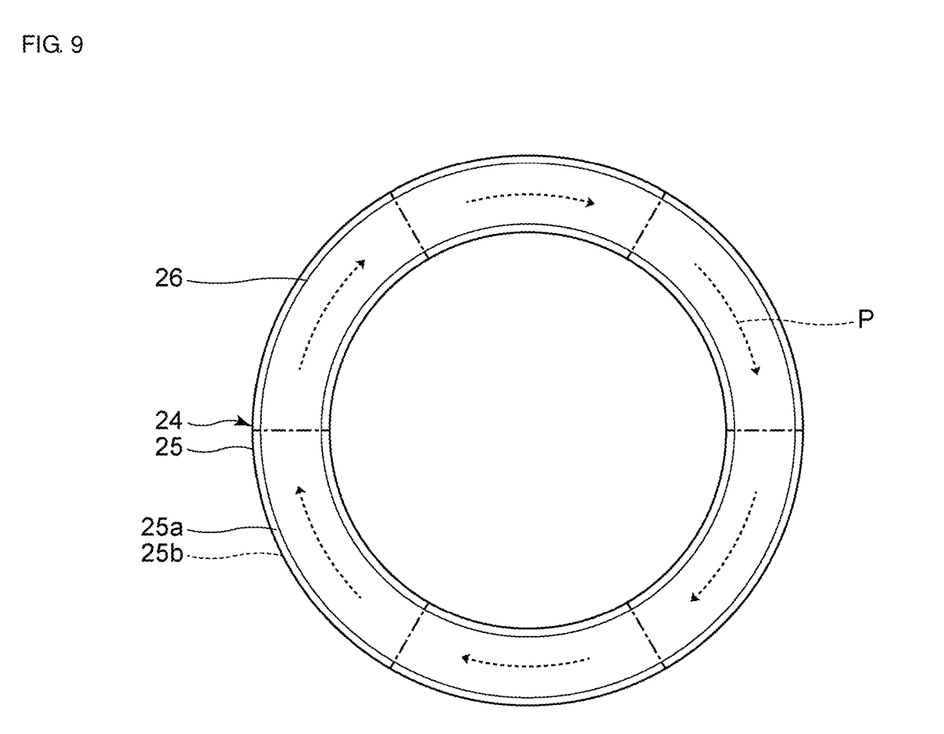
FIG. 9 is a plan view of piezoelectric elements in a second preferred embodiment of the present invention.

FIG. 9 is a plan view illustrating piezoelectric elements in a second preferred embodiment of the present invention.

The second preferred embodiment differs from the first preferred embodiment in that a piezoelectric element 24 includes a ring-shaped piezoelectric body 25. Other features of the vibration device of the second preferred embodiment are the same or substantially the same as that of the vibration device 1 of the first preferred embodiment.

The ring-shaped piezoelectric body 25 includes a first main surface 25a and a second main surface 25b, which face each other. The first main surface 25a is positioned on a side close to the first end portion of the cylindrical body and the second main surface 25b is positioned on a side close to the second end portion of the cylindrical body. The ring-shaped piezoelectric body 25 is divided into a plurality of regions along the circumferential direction of the cylindrical body. Single dot chain lines in FIG. 9 represent the boundaries between the plurality of regions. In the second preferred embodiment, the ring-shaped piezoelectric body 25 is divided into six regions. The ring-shaped piezoelectric body 25 is polarized and follows the circumferential direction of the cylindrical body in the plurality of regions. Excitation electrodes 26 are provided on the first main surface 25a and the second main surface 25b, the excitation electrodes 26 covering the plurality of regions.

In the second preferred embodiment, the cylindrical body torsionally vibrates as a result of an alternating-current voltage being applied to the excitation electrodes 26 of the piezoelectric element 24. Therefore, similarly to the first preferred embodiment, water droplets and foreign matter attached to the surface of the light-transmitting body inside the field of view of the imaging device are able to be more reliably removed.

Figure 10A:
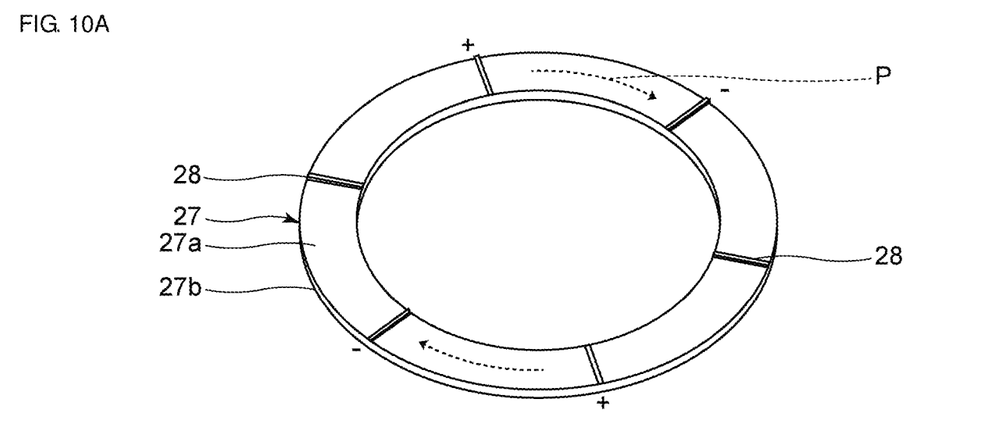
FIGS. 10A to 10C are perspective views showing a method of manufacturing a ring-shaped piezoelectric body in the second preferred embodiment of the present invention.
Figure 10B:
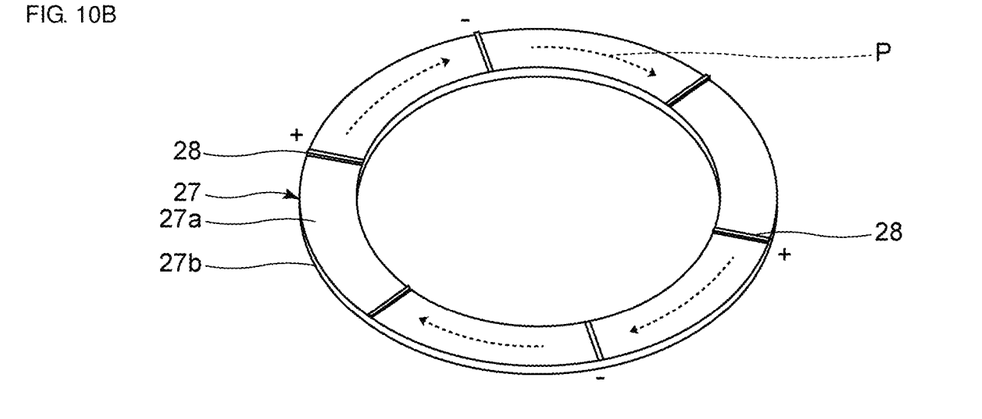
Figure 10C:
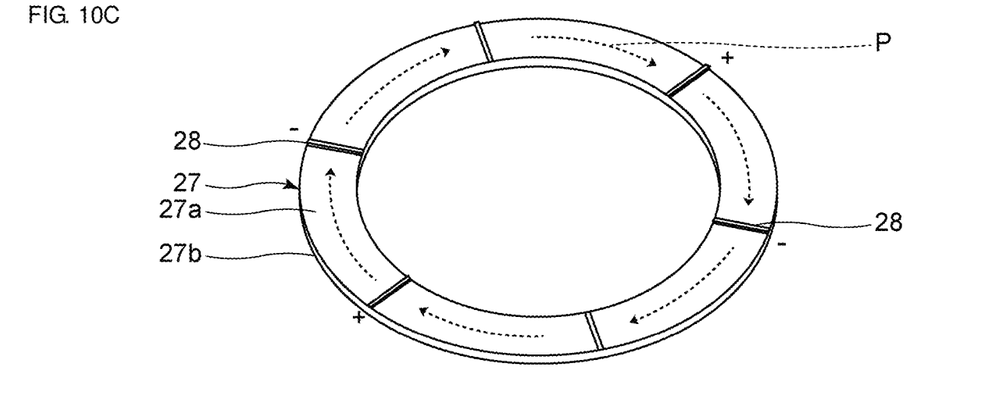
Figure 11:
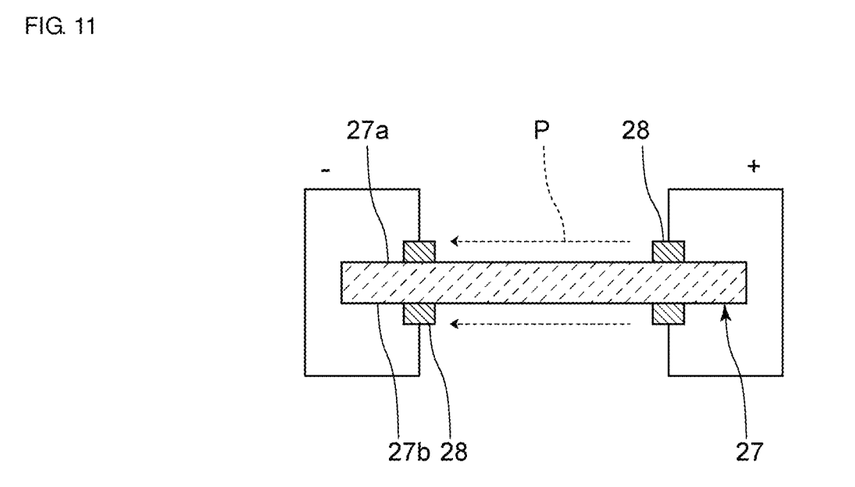
FIG. 11 is a schematic front sectional view showing the method of manufacturing the ring-shaped piezoelectric body in the second preferred embodiment of the present invention.

FIGS. 10A to 10C are perspective views showing a method of manufacturing the ring-shaped piezoelectric body in the second preferred embodiment. FIG. 11 is a schematic front sectional view showing a method of manufacturing the ring-shaped piezoelectric body in the second preferred embodiment. In addition, the symbols in FIGS. 10A to 10C and FIG. 11 indicate the signs of electric fields applied by polarization electrodes, which are described later.

As illustrated in FIG. 10A, a ring-shaped piezoelectric body 27 including a first main surface 27a and a second main surface 27b that face each other is prepared. Next, a plurality of polarization electrodes 28 are uniformly provided along the circumferential direction of the ring-shaped piezoelectric body 27 on the first main surface 27a of the ring-shaped piezoelectric body 27. Similarly, a plurality of polarization electrodes 28 are provided on the second main surface 27b and face the polarization electrodes 28 on the first main surface 27a. Thus, the ring-shaped piezoelectric body 27 is divided into a plurality of regions.

Next, a poling treatment is simultaneously performed using the polarization electrodes 28 on a pair of regions of the ring-shaped piezoelectric body 27 that are maximally or substantially maximally separated from each other. As illustrated in FIG. 11, polarization electrodes 28 that face each other in the thickness direction of the ring-shaped piezoelectric body 27 have the same sign and an electric field is applied in the circumferential direction of the regions.

Next, as illustrated in FIG. 10B, a poling treatment is performed on another pair of maximally or substantially maximally separated regions that are different from the regions polarized in the step illustrated in FIG. 10A. Next, as illustrated in FIG. 10C, a poling treatment is performed on another pair of maximally or substantially maximally separated regions that are different from the regions polarized in the steps illustrated in FIGS. 10A and 10B. Accordingly, the ring-shaped piezoelectric body 25 illustrated in FIG. 9 is able to be provided.

When manufacturing the ring-shaped piezoelectric body 25, the poling treatment is preferably simultaneously performed on a pair of regions, for example. Consequently, the total number of times the poling treatment is performed is able to be reduced and productivity is able to be increased.

Preferably, for example, the poling treatment is simultaneously performed on a pair of regions that are maximally or substantially maximally separated from each other. In the case where the regions on which the poling treatment is simultaneously performed are close to each other, there is a risk of a region located between the regions on which the poling treatment is being simultaneously performed being polarized in the opposite direction. By simultaneously performing the poling treatment on a pair of regions that are maximally or substantially maximally separated from each other, the situation in which a region located between that pair of regions becomes polarized in the opposite direction is able to be significantly reduced or prevented.

The ring-shaped piezoelectric body 27 illustrated in FIGS. 10A to 10C is preferably divided, for example, into at least six regions. Therefore, the distance between the regions on which the poling treatment is to be simultaneously performed is able to be effectively increased. Therefore, the situation in which a region located between the regions on which the poling treatment is being simultaneously performed becomes polarized in the opposite direction is able to be further significantly reduced or prevented.

Figure 12:
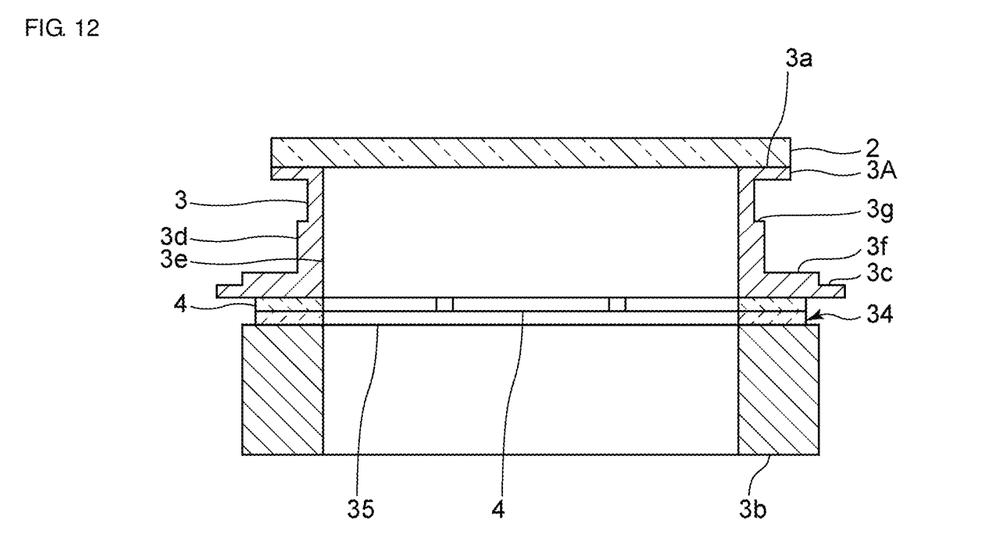
FIG. 12 is a front sectional view of a vibration device according to a third preferred embodiment of the present invention.

FIG. 12 is a front sectional view of a vibration device according to a third preferred embodiment of the present invention.

The third preferred embodiment differs from the first preferred embodiment in that the third preferred embodiment includes another piezoelectric vibrator 34 in addition to the piezoelectric elements 4. Other features of the vibration device of the third preferred embodiment are the same as, or similar to, that of the vibration device 1 of the first preferred embodiment.

The piezoelectric vibrator 34 includes a ring-shaped piezoelectric body 35. The ring-shaped piezoelectric body 35 is polarized parallel or substantially parallel to the axial direction of the cylindrical body 3. The ring-shaped piezoelectric body 35 includes a first main surface that is located on the first end portion 3a side of the cylindrical body 3 and a second main surface that is located on the second end portion 3b side of the cylindrical body 3. Although not illustrated, excitation electrodes are provided on the first main surface and the second main surface.

A respiratory vibration, which is a vibration mode in which the cylindrical body 3 is vibrated in the radial direction, is excited by applying an alternating-current voltage to the excitation electrodes of the piezoelectric vibration body 34. The light-transmitting body 2 undergoes bending vibration in response to the cylindrical body 3 undergoing respiratory vibration. Thus, the vibration mode is transformed. The piezoelectric vibrator 34 may instead be a piezoelectric vibrator in which a vertical vibration, which is a vibration mode in which the cylindrical body 3 is vibrated in the axial direction, is excited by applying an alternating-current voltage to the excitation electrodes. The light-transmitting body 2 also undergoes bending vibration in the case where the cylindrical body 3 undergoing vertical vibration.

Figure 13A:
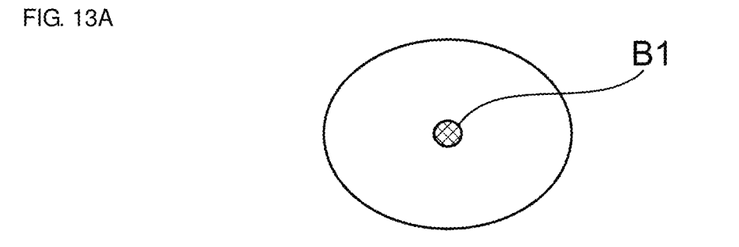
FIGS. 13A to 13D are schematic diagrams of vibration modes generated during propagation.

In the case where the disk-shaped light-transmitting body 2 vibrates as described above, this vibration mode is able to be expressed as an (m, n) mode. Here, m and n are integers. m is the number of vibration nodes that are present in the radial direction of the disk and n is the number of nodes that are present in the circumferential direction of the disk. FIG. 13A illustrates a (0, 0) mode vibration, FIG. 13B illustrates a (1, 0) mode, FIG. 13C illustrates a (0, 1) mode, and FIG. 13D illustrates a (0, 2) mode.

Figure 13B:
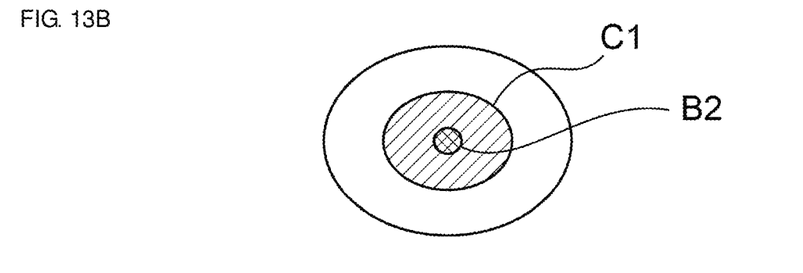
Figure 13C:
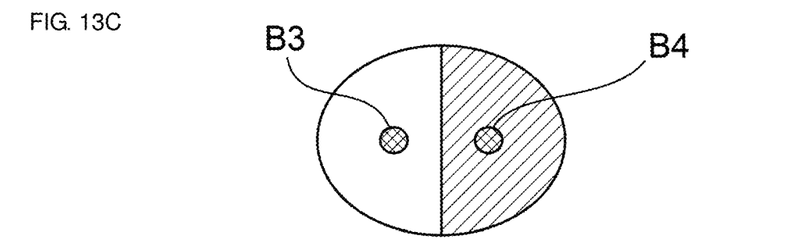
Figure 13D:
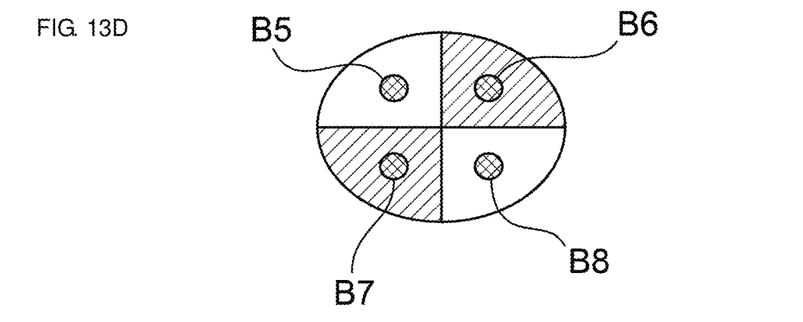

In FIGS. 13A to 13D, points B1, B2, B3, B4, and B5 to B8 shaded with hatching indicate the points of maximum or substantially maximum displacement. In addition, in FIGS. 13B to 13D, regions shaded with diagonal hatching and the white portions indicate portions that fluctuate with opposite phases. Therefore, in FIG. 13B, a circle Cl is a vibration node, the circle Cl is a singular node that exists in the radial direction and there are no nodes in the circumferential direction. Therefore, the vibration mode in FIG. 13B is able to be expressed as a (1, 0) mode.

In the case where water droplets are attached to the surface of the light-transmitting body 2 on the side close to the subject, the light-transmitting body 2 is vibrated in a (0, 0) mode or a (1, 0) mode. As a result, a large displacement is generated in the vicinity of a point of maximum or substantially maximum displacement and the attached water droplets are able to be atomized.

As illustrated in FIG. 12, the third preferred embodiment includes the piezoelectric elements 4 and the piezoelectric vibrator 34. Water droplets and foreign matter inside the field of view of the imaging device are able to be more reliably removed by switching between the torsional vibration generated by the piezoelectric elements 4 and the vibration mode generated by the piezoelectric vibrator 34.

More specifically, water droplets and foreign matter are moved to the outside of the light-transmitting body 2 by the torsional vibration generated by the piezoelectric elements 4 and the moved water droplets and foreign matter are then removed through the vibration mode generated by the piezoelectric vibrator 34.

In the third preferred embodiment, the water droplets and foreign matter moved to the outside of the light-transmitting body 2 are able to be more reliably removed. Therefore, the third preferred embodiment is particularly suitable for imaging device with a wide field of view.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
a light-transmitting body that is located on a subject side of an imaging element;
a cylindrical body that includes a first end portion, a second end portion on an opposite side from the first end portion, and an outer surface and an inner surface that connect the first end portion and the second end portion to each other, the cylindrical body being connected to the light-transmitting body and holding the light-transmitting body on the first end portion side thereof; and
a piezoelectric element that is provided along a circumferential direction of the cylindrical body and that torsionally vibrates the cylindrical body.

2. The vibration device according to claim 1, wherein
at least one of the outer surface and the inner surface includes a step portion in a portion of the cylindrical body located between a portion where the piezoelectric element is provided and the first end portion in a direction that connects the first end portion and the second end portion of the cylindrical body to each other; and
a distance between the outer surface and the inner surface is a thickness of the cylindrical body, and the thickness decreases via the step portion from a side close to the piezoelectric element toward a side close to the first end portion.

3. The vibration device according to claim 2, wherein
the outer surface of the cylindrical body includes the step portion; and
a portion of the outer surface that is continuous with the step portion and extends toward the first end portion is more inwardly located than a portion of the outer surface that is continuous with the step portion and extends toward the piezoelectric element.

4. The vibration device according to claim 1, wherein
at least one of the outer surface and the inner surface includes an inclined portion that extends and is inclined with respect to the direction that connects the first end portion and the second end portion of the cylindrical body in a portion located between the portion where the piezoelectric element is provided and the first end portion in the direction that connects the first end portion and the second end portion of the cylindrical body; and
a distance between the outer surface and the inner surface is a thickness of the cylindrical body, and the inclined portion is provided so that the thickness decreases from a side close to the piezoelectric element toward a side close to the first end portion.

5. The vibration device according to claim 4, wherein
the outer surface of the cylindrical body includes the inclined portion; and
the inclined portion extends from the side close to the piezoelectric element toward the side close to the first end portion and toward an interior of the cylindrical body.

6. The vibration device according to claim 1, wherein the piezoelectric element is located between the first end portion and the second end portion of the cylindrical body.

7. The vibration device according to claim 1, wherein the piezoelectric element is located at a position of a node of a torsional vibration of the cylindrical body.

8. The vibration device according to claim 1, wherein
a plurality of the piezoelectric elements are provided;
the plurality of piezoelectric elements are provided in an annular shape along a circumferential direction of the cylindrical body and are spaced apart from each other; and
the plurality of piezoelectric elements each include a piezoelectric body and the plurality of piezoelectric bodies are polarized to follow the circumferential direction of the cylindrical body.

9. The vibration device according to claim 1, wherein
the piezoelectric element includes a ring-shaped piezoelectric body;
the ring-shaped piezoelectric body includes a first main surface that is located on a side close to the first end portion of the cylindrical body and a second main surface that is located on a side close to the second end portion of the cylindrical body;
the ring-shaped piezoelectric body is divided into a plurality of regions along the circumferential direction of the cylindrical body and the ring-shaped piezoelectric body is polarized to follow the circumferential direction of the cylindrical body in the plurality of regions; and
excitation electrodes are provided on the first main surface and the second main surface, the excitation electrodes covering the plurality of regions.

10. The vibration device according to claim 9, wherein the ring-shaped piezoelectric body is divided into at least six regions.

11. The vibration device according to claim 1, further comprising:
another piezoelectric vibrator; wherein
the another piezoelectric vibrator provides one of a vibration mode in which the piezoelectric vibrator vibrates the cylindrical body in a direction that connects the inner surface and the outer surface to each other and a vibration mode in which the piezoelectric vibrator vibrates the cylindrical body in a direction that connects the first end portion and the second end portion to each other.

12. The vibration device according to claim 1, wherein the light-transmitting body has a disc shape or a dome shape.

13. The vibration device according to claim 1, wherein
the cylindrical body includes a first cylindrical body portion that includes the first end portion and a second cylindrical body portion that includes the second end portion; and
the piezoelectric element is provided between the first cylindrical body portion and the second cylindrical body portion.

14. The vibration device according to claim 1, wherein the piezoelectric element is provided in a groove of the cylindrical body.

15. The vibration device according to claim 1, wherein
the cylindrical body includes a support portion that includes the first end portion;
the support portion of the cylindrical body is fixed to a peripheral portion of a surface of the light-transmitting body on a side of the cylindrical body; and
an opening of the cylindrical body on a side of the first end portion side is closed by the light-transmitting body.

16. The vibration device according to claim 1, wherein the cylindrical body includes stainless steel, the cylindrical body includes a composite body including a resin and a material with a higher rigidity than the resin, or the cylindrical body includes glass.

17. The vibration device according to claim 8, wherein a shape of the piezoelectric body of each of the plurality of piezoelectric elements is a rectangular parallelepiped shape or a substantially rectangular parallelepiped shape.

18. The vibration device according to claim 1, wherein
the cylindrical body includes a first step portion and a second step portion;
the first step portion and the second step portion are located between a portion of the cylindrical body where the piezoelectric element is located and the first end portion of the cylindrical body, in an axial direction of the cylindrical body; and
the first step portion and the second step portion extend in a radial direction of the cylindrical body and along the circumferential direction of the cylindrical body.

19. The vibration device according to claim 18, wherein
a portion of the outer surface that is continuous with the first step portion and extends toward the first end portion is located closer to an interior of the cylindrical body than a portion of the outer surface that is continuous with the first step portion and extends toward the piezoelectric element; and
a portion of the outer surface that is continuous with the second step portion and extends toward the first end portion is located closer to the interior of the cylindrical body than the portion of the outer surface that is continuous with the second step portion and extends toward the piezoelectric element.

* * * * *